US012725897B2

(12) United States Patent
Chuang et al.

(10) Patent No.: US 12,725,897 B2
(45) Date of Patent: Sep. 1, 2026

(54) FLEXIBLE COPLANAR WAVEGUIDE LOW PROFILE HIGH SPEED TRANSMISSION CIRCUIT AND FABRICATION METHOD OF THE SAME

(71) Applicant: QuantumZ Inc., Kaohsiung City (TW)

(72) Inventors: I-Chun Chuang, Kaohsiung City (TW); Yu-Ni Hsiao, Kaohsiung City (TW); Meng-Hua Tsai, Kaohsiung City (TW); Wei Ting Lee, Kaohsiung City (TW); Sin-Siang Wang, Kaohsiung City (TW)

(73) Assignee: QuantumZ Inc., Kaohsiung City (TW)

( * ) Notice: Subject to any disclaimer, the term of this patent is extended or adjusted under 35 U.S.C. 154(b) by 45 days.

(21) Appl. No.: 18/963,507

(22) Filed: Nov. 28, 2024

(65) Prior Publication Data

US 2025/0253514 A1 Aug. 7, 2025

(30) Foreign Application Priority Data

Feb. 7, 2024 (TW) ................................ 113104995

(51) Int. Cl.
*H01P 3/00* (2006.01)
*H01P 11/00* (2006.01)
*H05K 9/00* (2006.01)

(52) U.S. Cl.
CPC ............ *H01P 3/003* (2013.01); *H01P 11/001* (2013.01); *H05K 9/0081* (2013.01)

(58) Field of Classification Search
CPC ...... H01P 3/003; H01P 11/001; H05K 9/0081
USPC ........ 333/24 R, 33, 236, 238, 241, 245, 246
See application file for complete search history.

(56) References Cited

U.S. PATENT DOCUMENTS 9,583,836 B2 * 2/2017 Kato ......................... H01P 1/02
2015/0098599 A1 * 4/2015 Flood ..................... H04R 25/55 381/315
2016/0380326 A1 * 12/2016 Hall ...................... H01P 11/003 333/238
2022/0140514 A1 * 5/2022 Buck .................... H05K 1/0221 439/493

* cited by examiner

*Primary Examiner* — Jorge L Salazar, Jr.
(74) *Attorney, Agent, or Firm* — CKC & Partners Co., LLC

(57) ABSTRACT

A flexible coplanar waveguide low profile high speed transmission circuit and a fabrication method of the transmission line structure are provided. The flexible coplanar waveguide low profile high speed transmission circuit includes a first flexible substrate, a second flexible substrate, a circuit layer, a first electromagnetic interference (EMI) shielding film and a second electromagnetic interference shielding film. In the fabrication method, the circuit layer is disposed between the first flexible substrate and the second flexible substrate and laminated. Then, electromagnetic interference shielding films are adhered to the flexible substrates. The flexible coplanar waveguide low profile transmission circuit satisfies following equation:

$$\tan\left(\frac{DT/TS}{DK}\right) \geq 1,$$

where DT is the distance between a grounded line and a signal transmission circuit, TS is the thickness of the flexible substrate, and DK is the dielectric constant of the flexile substrate.

16 Claims, 8 Drawing Sheets pressing step shielding film adhering step

FLEXIBLE COPLANAR WAVEGUIDE LOW PROFILE HIGH SPEED TRANSMISSION CIRCUIT AND FABRICATION METHOD OF THE SAME

CROSS-REFERENCE TO RELATED APPLICATION

This application claims priority to Taiwan Application Serial Number 113104995, filed Feb. 7, 2024, which is herein incorporated by reference in its entirety.

BACKGROUND

Field of Invention

The present invention relates to a flexible coplanar waveguide low profile high speed transmission circuit and a fabrication method of the same.

Description of Related Art

With the rapid advancement of technology in recent years, portable electronic products such as tablet PCs, NBs, smartphones or other portable devices are commonly used in our daily lives. Demands for high speed signal transmission between multiple chips in a device or between multiple devices are ever increasing.

Transmission circuits used in such portable devices may be required to fold or bend to accommodate shapes and decrease the size of the portable device, thereby satisfying the demand for convenience of carrying the portable device. Further, when wireless communication of the portable device has higher frequencies, the wavelength of the signal transmitted by a connection circuit is shorter and susceptible to various electromagnetic interferences (EMI) both internally and externally. Multi-layer Printed circuit board (PCB) with microstrips has been utilized for high speed transmission. A signal layer is on a ground layer or is sandwiched by two ground layers for EMI reduction. However, it is hard to shape and bend such structure, and it is easy to cause failure situations of loose connections between layers and cracks of cooper wires.

Therefore, a new coplanar waveguide low profile high speed transmission circuit that satisfies the demands for being flexible and having higher EMI resistance is presented.

SUMMARY

Embodiments of the present invention provide a flexible coplanar waveguide low profile high speed transmission circuit and a fabrication method of the same. The flexible coplanar waveguide low profile high speed transmission circuit has a thinner thickness to satisfy the demand for being foldable and better EMI resistance.

In accordance with embodiments of the present invention, the flexible coplanar waveguide low profile high speed transmission circuit includes a circuit layer, a first flexible substrate, a second flexible substrate, a first electromagnetic interference (EMI) shielding film and a second EMI shielding film. The circuit layer includes a signal transmission circuit and two grounded circuits, in which the signal transmission circuit is disposed between the two grounded circuits. The first flexible substrate is disposed on a first surface of the circuit layer. The second flexible substrate is disposed on a second surface of the circuit layer, in which the second surface is opposite to the first surface. The first EMI shielding film is disposed on the first flexible substrate, in which the first EMI shielding film and the circuit layer are located on two opposite surfaces of the first flexible substrate. The second EMI shielding film is disposed on the second flexible substrate, in which the second EMI shielding film and the circuit layer are located on two opposite surfaces of the second flexible substrate. The flexible coplanar waveguide low profile high speed transmission circuit satisfy the following equation:

$$\tan\left(\frac{DT/TS}{DK}\right) \geq 1$$

where DT is a distance between the signal transmission circuit line and one of the grounded line; TS is a thickness of the first flexible substrate and a thickness of the second flexible substrate, and DK is the dielectric constant of the first flexible substrate and the second flexible substrate.

In some embodiments, the first flexible substrate and the second flexible substrate are liquid crystal polymer (LCP) flexible substrates.

In some embodiments, the circuit layer directly contacts the first flexible substrate and the second flexible substrate.

In some embodiments, the first EMI shielding film includes a first shielding metal layer and a first adhering layer. The first adhering layer is disposed between the first shielding metal layer and the first flexible substrate to enable first EMI shielding film to be adhered to the first flexible substrate. The second EMI shielding film includes: a second shielding metal layer and a second adhering layer. A second adhering layer is disposed between the second shielding metal layer and the second flexible substrate to enable second EMI shielding film to be adhered to the second flexible substrate.

In some embodiments, a thickness of the first flexible substrate and a thickness of the second flexible substrate are respectively in a range from 30 μm to 200 μm.

In some embodiments, the circuit layer has a thickness equal to 35 μm.

In some embodiments, the dielectric constant DK is in a range from 2.7 to 4.

In some embodiments, the signal transmission circuit includes a pair of differential transmission lines.

BRIEF DESCRIPTION OF THE DRAWINGS

The invention can be more fully understood by reading the following detailed description of the embodiment, with reference made to the accompanying drawings as follows.

Figure 1:
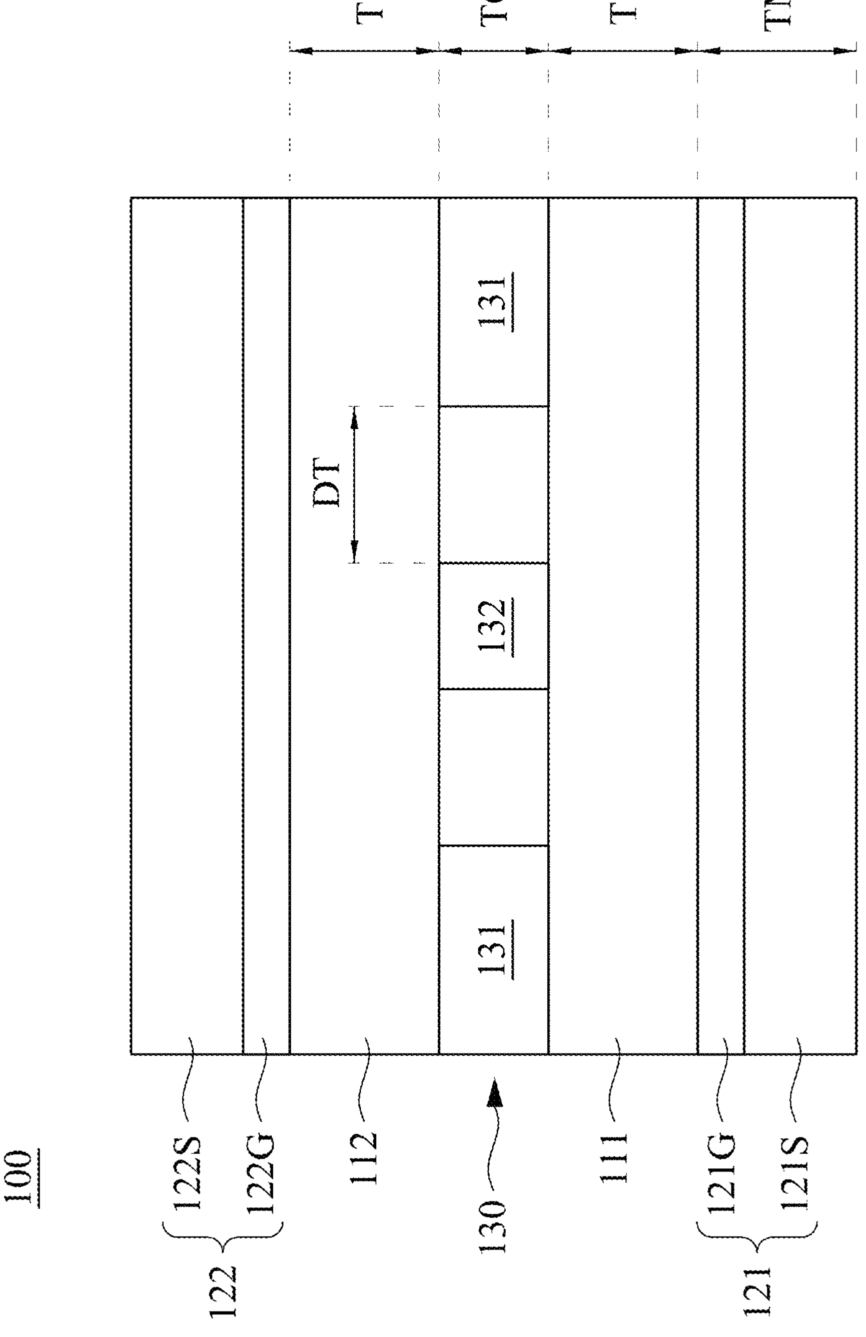
FIG. 1 is a schematic diagram showing a transmission circuit in accordance with embodiments of the present invention.

In accordance with customary practice, the various features and elements in the drawings are not drawn to scale, but are drawn in a manner that best represents the specific features and elements relevant to the present disclosure. Furthermore, among the different drawings, similar elements/components are referred to by the same or similar reference numerals.

DETAILED DESCRIPTION

Specific embodiments of the present invention are further described in detail below with reference to the accompanying drawings, however, the embodiments described are not intended to limit the present invention and it is not intended for the description of operation to limit the order of implementation. Moreover, any device with equivalent functions that is produced from a structure formed by a recombination of elements shall fall within the scope of the present invention. Additionally, the drawings are only illustrative and are not drawn to actual sizes and proportions.

The using of “first”, “second”, “third”, etc. in the specification should be understood for identifying units or data described by the same terminology but are not referred to particular order or sequence.

Referring to FIG. 1, a transmission circuit 100 includes a first flexible substrate 111, a second flexible substrate 112, a first electromagnetic interference (EMI) shielding film 121, a second EMI shielding film 122 and a circuit layer 130. The circuit layer 130 includes a circuit configured to transmit data, and disposed between the first flexible substrate 111 and the second flexible substrate 112. In some embodiments, the circuit layer 130 directly contacts the first flexible substrate 111 and the second flexible substrate 112, but embodiments of the present invention are not limited thereto.

In some embodiments, the circuit layer 130 uses coplanar waveguide (CPW) structure to transmit data. The circuit layer 130 includes two grounded circuits (lines) 131 and a signal transmission circuit (line) 132, in which the signal transmission line 132 is disposed between the two grounded lines 131, and the transmission line 132 and the two grounded lines 131 are disposed in parallel, thereby forming a coplanar waveguide structure. In some embodiments, the grounded lines 131 and the signal transmission line 132 can be formed by etching a cooper layer.

In some embodiments, the first flexible substrate 111 and the second flexible substrate 112 are liquid crystal polymer (LCP) flexible substrate, but embodiments of the present invention are not limited thereto. In other embodiments of the present invention, the first flexible substrate 111 and the second flexible substrate 112 can be other materials of flexible substrates, for example polyimide (PI) or modified polyimide (MPI).

The first EMI shielding film 121 is disposed on the first flexible substrate 111 and adhered to an outer surface of the first flexible substrate 111. In other words, the first EMI shielding film 121 and the circuit layer 130 are disposed on two opposite surfaces of the first flexible substrate 111, in which the first EMI shielding film 121 is disposed on the outer surface of the first flexible substrate 111, and the circuit layer 130 is disposed on an inner surface of the first flexible substrate 111. In some embodiments, both the first EMI shielding film 121 and the circuit layer 130 directly contact the first flexible substrate 111, but embodiments of the present invention are not limited thereto.

The first EMI shielding film 121 includes a first shielding metal layer 121S and a first adhering layer 121G. The first shielding metal layer 121S is configured to provide a primary EMI shield effect to avoid that the inner circuit layer 130 suffer EMI from external devices when transmitting data. The first adhering layer 121G is configured to enable the first shielding metal layer 121S to be adhered to and fixed on the first flexible substrate 111, and also provide a secondary EMI shielding effect. In some embodiments, materials of the first adhering layer 121G include NiCr and NiV, and further include glue material for adhering the first EMI shielding film 121 to the outer surface of the first flexible substrate 111. Material of the first shielding metal layer 121S includes silver and/or copper to provide the primary EMI shield effect. However, embodiments of the present invention are not limited thereto. In other embodiments, the first adhering layer 121G/the first shielding metal layer 121S can use other metal material having EMI shield effect.

The second EMI shielding film 122 is disposed on the second flexible substrate 112 and adhered to the outer surface of the second flexible substrate 112. In other words, the second EMI shielding film 122 and the circuit layer 130 are disposed on two opposite surfaces of the second flexible substrate 112, in which the second EMI shielding film 122 is disposed on an outer surface of the second flexible substrate 112, and the circuit layer 130 is disposed on an inner surface of the second EMI shielding film 122. In some embodiments, both the first EMI shielding film 122 and the circuit layer 130 directly contact the second flexible substrate 112, but embodiments of the present invention are not limited thereto.

The second EMI shielding film 122 includes a second shielding metal layer 122S and a second adhering layer 122G. The second shielding metal layer 122S is configured to provide a primary EMI shield effect to avoid that the inner circuit layer 130 suffer EMI from external devices when transmitting data. The second adhering layer 122G is configured to enable the second shielding metal layer 122S to be adhered to and fixed on the second flexible substrate 112, and also provide a secondary EMI shielding effect. In some embodiments, materials of the second adhering layer 122G include NiCr and NiV, and further include glue material for adhering the second EMI shielding film 122 to the outer surface of the second flexible substrate 112. Material of the second shielding metal layer 122S includes silver and/or copper to provide the primary EMI shield effect. However, embodiments of the present invention are not limited thereto. In other embodiments, the second adhering layer 122G/the second shielding metal layer 122S can use other metal material having EMI shield effect.

In this embodiment, it is effectively avoided that the circuit layer 130 suffers EMI because the circuit layer 130 is located between the first EMI shielding film 121 and the second EMI shielding film 122. The transmission circuit 100 has better EMI resistance.

In addition, each of the first flexible substrate 111 and the second flexible substrate 112 has a thickness TS, each of the first EMI shielding film 121 and the second EMI shielding film 122 has a thickness TM, and the circuit layer has a thickness TC. In this embodiment, the thickness TS is in a range from 30 μm to 200 μm, the thickness TM is in a range from 12 μm to 22 μm, and the thickness TC in a range from 10 μm to 40 μm. By using the above design of the thicknesses, it is ensured that the data transmission can be performed normally. Compared with conventional transmission line structures, the transmission circuit 100 of the embodiments of the present invention has better EMI resistance when performing a high speed data transmission, and can be greatly bent/folded to satisfy demands of various electronic products. In some embodiments, the thickness TS is designed in a range from 30 μm to 100 μm, so that the transmission circuit 100 is enabled to be repeatedly bent/folded multiple times for user's demands. In some embodiments, the thickness TS is designed in a range from 100 μm to 200 μm, so that the transmission circuit 100 is enabled to be easily maintained in a bent/folded state after being bent/folded one time.

Figure 2:
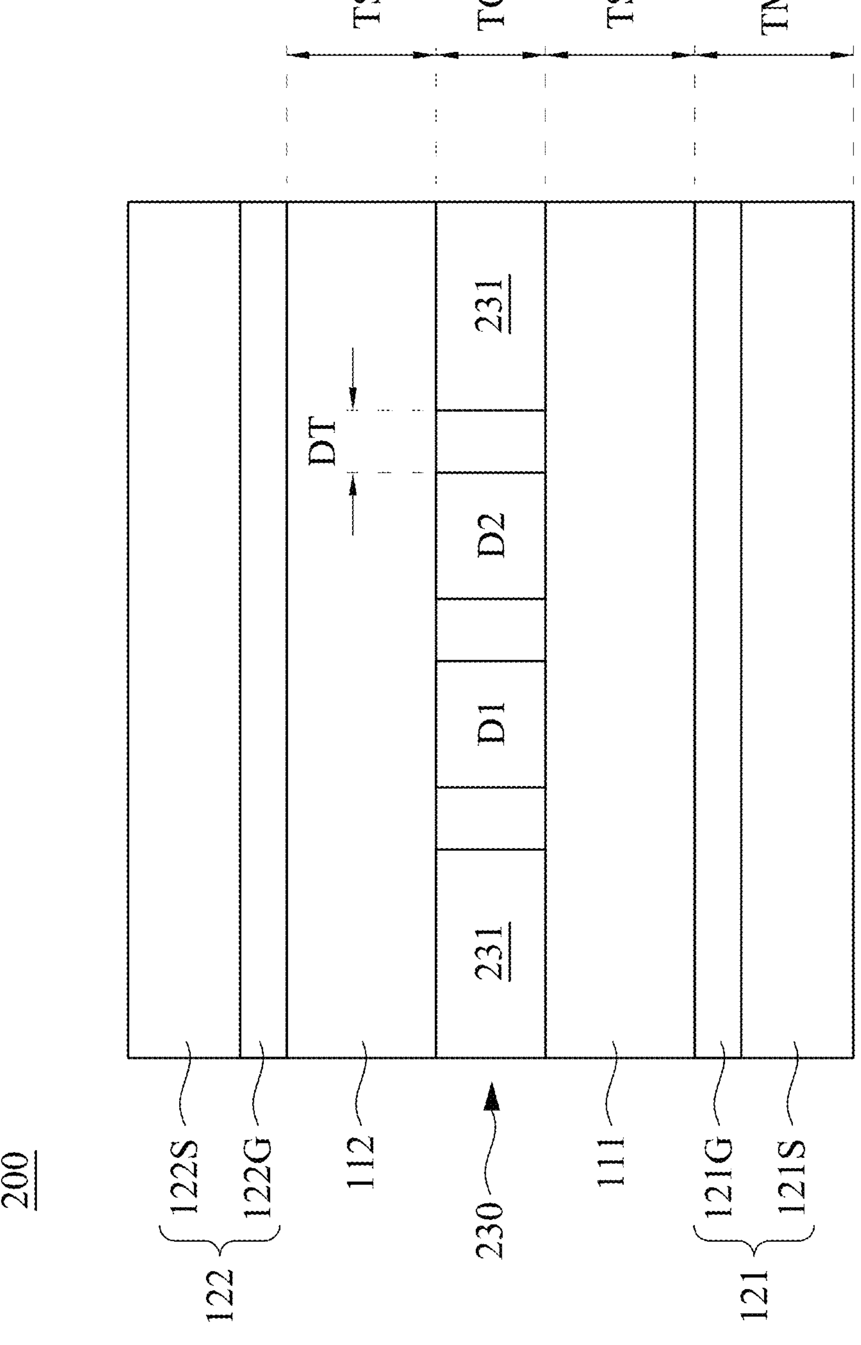
FIG. 2 is a schematic diagram showing a transmission circuit in accordance with embodiments of the present invention.

Referring to FIG. 2, in accordance with another embodiment of the present invention, a transmission circuit 200 similar to the transmission circuit 100 is provided. The difference is that a differential pair (GSSG) structure is applied in a circuit layer 230 of the transmission circuit 200 for data transmission. Specifically, the circuit layer 230 includes a pair of differential signal transmission lines D1, D2 disposed between grounded circuits (lines) 231, and the differential signal transmission lines D1, D2 and the grounded lines 231 are coplanar. Compared with the transmission circuit 100, the transmission circuit 200 has better EMI resistance.

Figure 3:
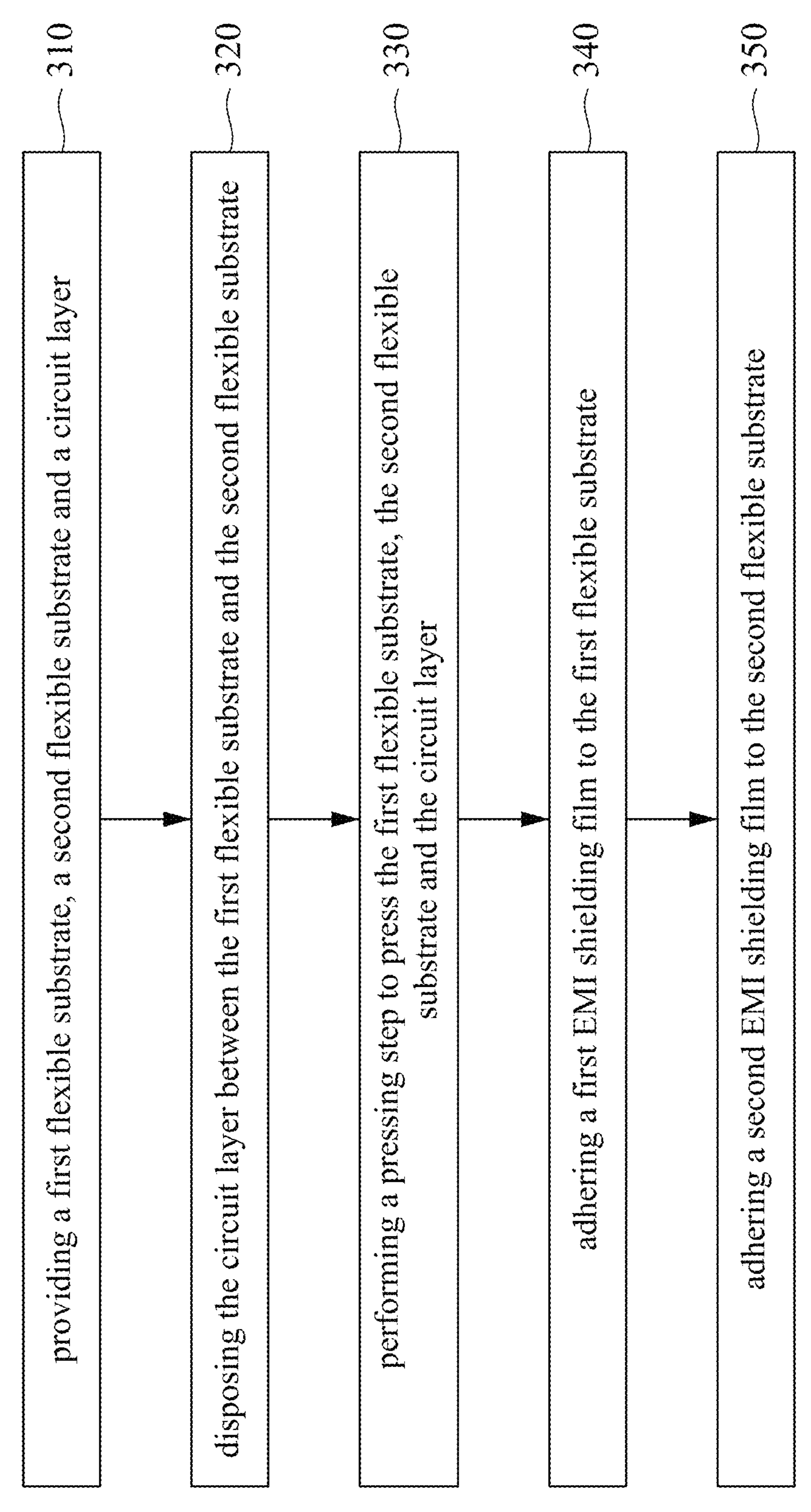
FIG. 3 is a schematic diagram showing a flow chart of a fabrication method of the transmission circuit in accordance with embodiments of the present invention.
Figure 4:
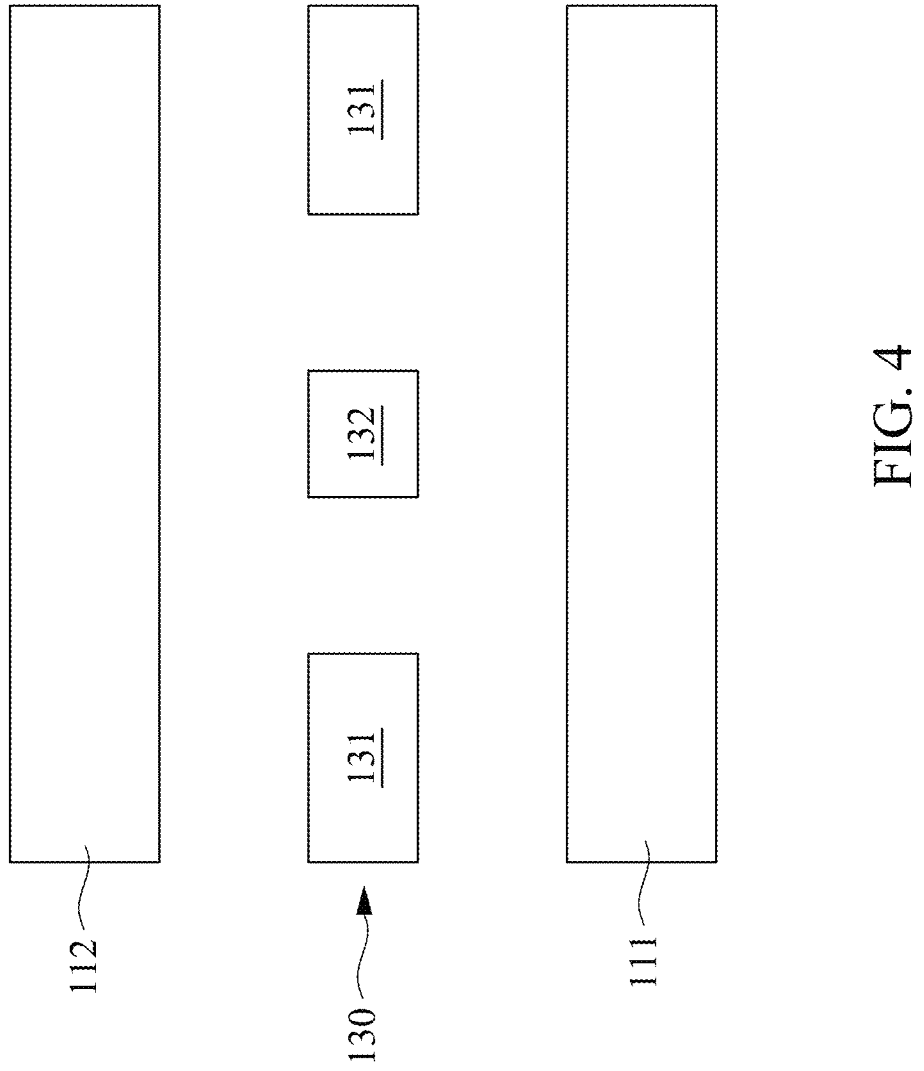
FIG. 4 is a schematic diagram showing a first flexible substrate, a second flexible substrate and a circuit layer in accordance with embodiments of the present invention.
Figure 5:
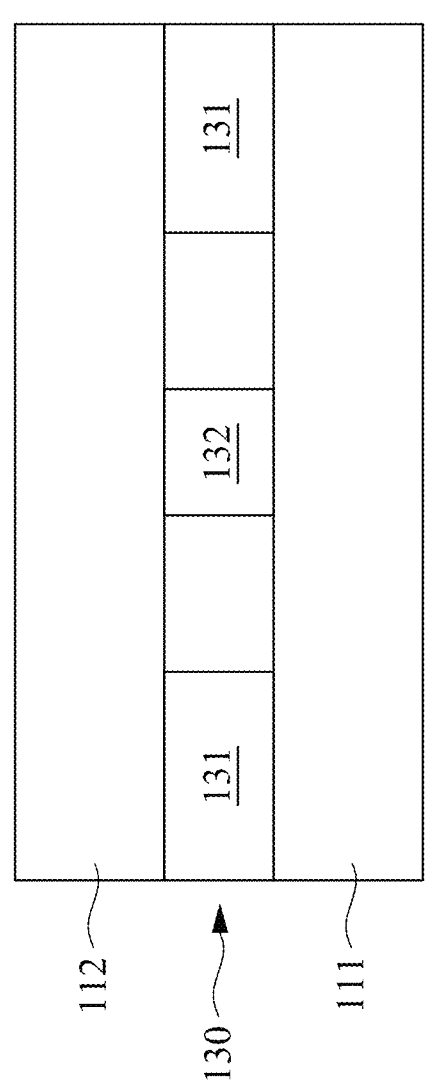
FIG. 5 is a schematic diagram showing a pressing step for pressing the first flexible substrate, the second flexible substrate and the circuit layer in accordance with embodiments of the present invention.
Figure 6:
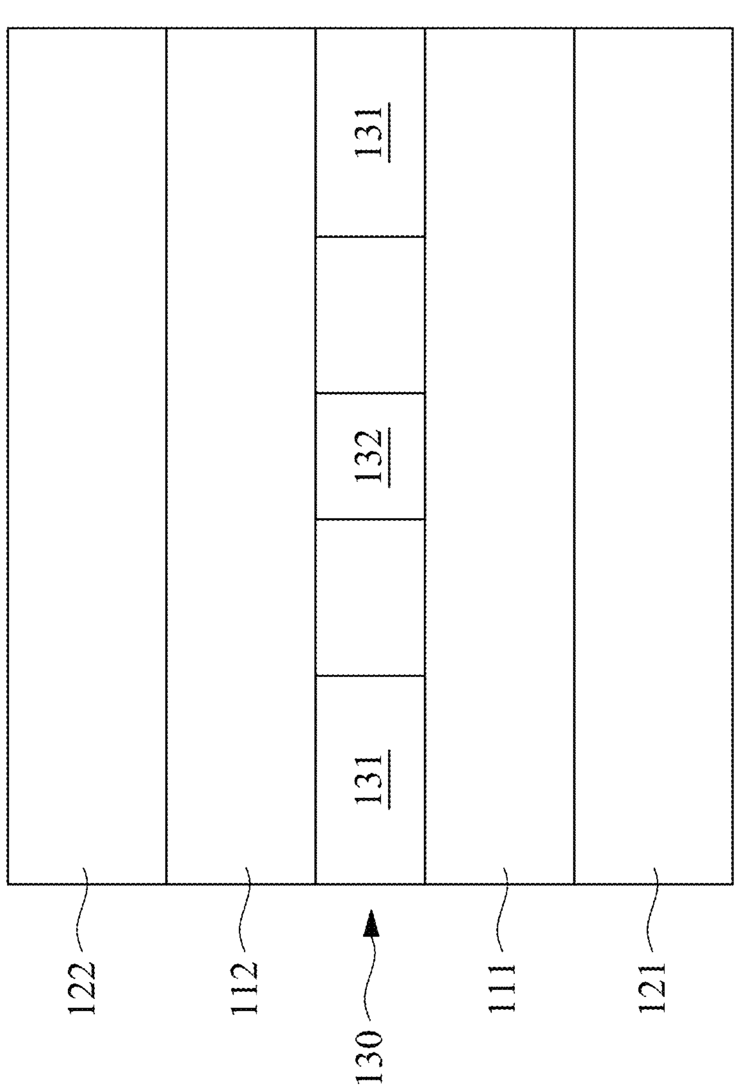
FIG. 6 is a schematic diagram showing an adhering step for adhering a first EMI shielding film and a second EMI shielding film in accordance with embodiments of the present invention.

Referring to FIG. 3, FIG. 3 is a schematic diagram showing a flowchart of a fabrication method 300 of the transmission circuit 100. In the fabrication method 300, at first, step 310 and step 320 are performed to provide the first flexible substrate 111, the second flexible substrate 112 and the circuit layer 130, and to dispose the circuit layer 130 between the first flexible substrate 111 and the second flexible substrate 112, as shown in FIG. 4. In this embodiment, the first flexible substrate 111 and the second flexible substrate 112 are LCP flexible substrates, and the circuit layer 130 is a copper layer etched to have circuit patterns. However, embodiments of the present invention are not limited thereto. Thereafter, step 330 is performed to press the first flexible substrate 111, the second flexible substrate 112 and the circuit layer 130, as shown in FIG. 5. Therefore, a circuit board having a structure of three layers is formed by pressing the first flexible substrate 111, the second flexible substrate 112 and the circuit layer 130. Then, step 340 and 350 are performed to respectively adhere the first EMI shielding film 121 and the second EMI shielding film 122 to the first flexible substrate 111 and the second flexible substrate 112, as shown in FIG. 6. In this embodiment, because the first EMI shielding film 121 and the second EMI shielding film 122 respectively have the first adhering layer 121G and the second adhering layer 122G, the first EMI shielding film 121 and the second EMI shielding film 122 can be easily adhered to the first flexible substrate 111 and the second flexible substrate 112 by using the first adhering layer 121G and the second adhering layer 122G. In some embodiments, the first flexible substrate 111 and the second flexible substrate 112 are liquid crystal polymer (LCP) flexible substrate. The LCP flexible substrate and EMI shielding film are layered and bonded to provide excellent thermal stability, low moisture absorption, and good electrical insulating capabilities. The LCP substrate acts as a dielectric layer to the EMI shielding layer to enhance reflection and absorption of electromagnetic waves. This is particularly effective in higher frequency ranges such as 5G or millimeter wave radio frequency (RF) ranges.

Figure 7:
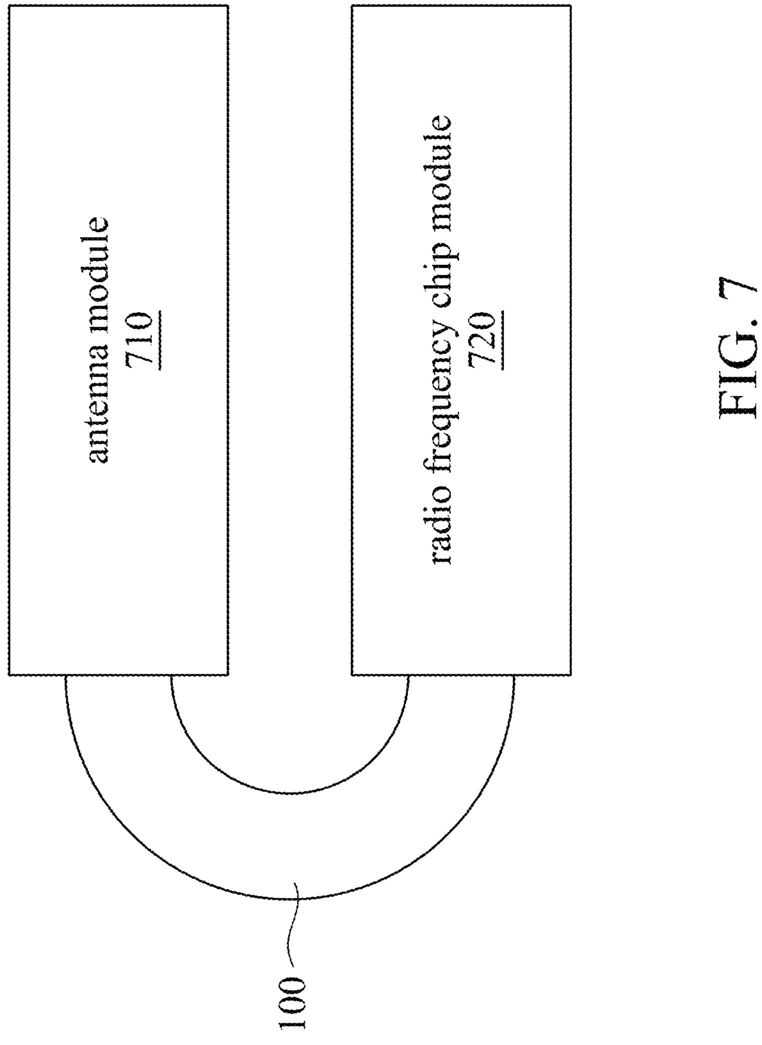
FIG. 7 is a schematic diagram showing the connection of the transmission circuit in accordance with embodiments of the present invention.

Referring to FIG. 7, FIG. 7 is a schematic diagram showing the connection of the transmission circuit 100. The transmission circuit 100 can be bent/folded to accommodate various shapes and spaces of electric devices. As shown in FIG. 7, in some embodiments, the antenna module 710 needs a high speed transmission line for receiving high speed/high frequency electric signals from a radio frequency chip module 720. Because the transmission circuit 100 can be greatly bent/folded into various shapes for connection between the antenna module 710 and the radio frequency chip module 720 to allow high speed data transmission.

Returning to FIG. 1 and FIG. 2, in some embodiments, a distance DT between the signal transmission line 132 and the grounded line 131, a thickness TS of each of the flexible substrates and a dielectric constant DK of each of the flexible substrates satisfy the following equation:

$$\tan\left(\frac{DT/TS}{DK}\right) \geq 1. \tag{1}$$

Figure 8:
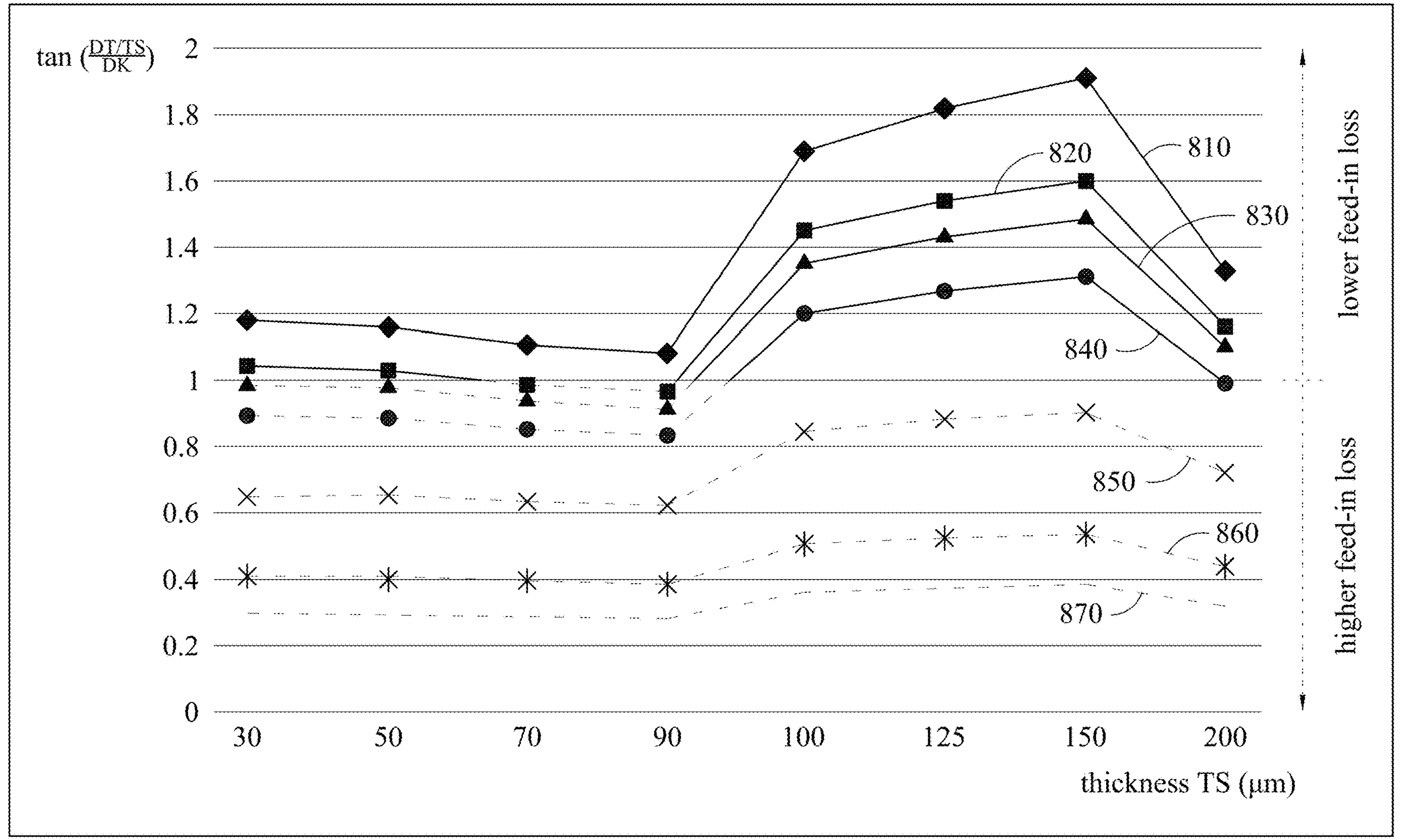
FIG. 8 is a schematic diagram showing curves representing relationships between different thicknesses and dielectric constants of the flexible substrates in accordance with embodiments of the present invention.

When the distance DT, the thickness TS and the dielectric constant DK satisfy the above equation (1), the transmission circuit 100/200 of the present invention has a better insertion loss and remaining flexible. Referring to FIG. 8, the horizontal axis corresponds to the thickness TS; the vertical axis is corresponds to a calculation result of $$\tan\left(\frac{DT/TS}{DK}\right);$$

a curve 810 corresponds to a condition of DK-2.7; a curve 820 corresponds to a condition of DK=2.9; a curve 830 corresponds to a condition of DK=3; a curve 840 corresponds to a condition of DK=3.2; a curve 850 corresponds to a condition of DK=4; a curve 860 corresponds to a condition of DK=6; a curve 870 corresponds to a condition of DK=8. It can be understood from FIG. 8 that some embodiments of the present invention a have better insertion loss in the cases of varied thickness and varied dielectric constant, for example the thickness TS is varied in a range between 30 μm to 200 μm and the dielectric constant DK is varied in a range between 2.7 to 8 when a signal of 10 GHz passes through the transmission circuit 100/200 of the present invention, in which the equation (1) is satisfied. However, embodiments of the present invention are not limited thereto. The equation (1) of the embodiments of the present invention is also adapted for signals higher than 10 GHz, for example millimeter wave signals.

Regarding the curves 850-870, because the curves 850-870 do not satisfy the above equation (1), corresponding insertion losses are higher than −1.0 dB and cannot satisfy the demands of the present invention. Regarding the curves 820-840, because a first portion of the curves 820-840 (shown in doted lines) do not satisfy the above equation (1) and a second portion of the curves 820-840 satisfy the above equation (1), the insertion losses corresponding to the second portion of the curves 820-840 are lower than or equal to −1.0 dB. Regarding the curve 810, because the curve 810 satisfies the above equation (1), corresponding insertion losses are lower than or equal to −1.0 dB.

In some embodiments, the dielectric constant DK of the flexible substrates is in arrange: 2≤DK3. Further, in some embodiments, the dielectric constant DK of the flexible substrates is in arrange: 3≤DK<4. Further, in some embodiments, the dielectric constant DK of the flexible substrates is in arrange: 4≤DK<5. Further, in some embodiments, the dielectric constant DK of the flexible substrates is in arrange: 5≤DK<6. Further, in some embodiments, the dielectric constant DK of the flexible substrates is in arrange: 6≤DK<7. Further, in some embodiments, the dielectric constant DK of the flexible substrates is in arrange: 7≤DK<8.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A flexible coplanar waveguide low profile high speed transmission circuit, comprising:

a circuit layer comprising a signal transmission circuit and two grounded circuits, wherein the signal transmission circuit is disposed between the two grounded circuits;

a first flexible substrate disposed on a first surface of the circuit layer;

a second flexible substrate disposed on a second surface of the circuit layer, wherein the second surface is opposite to the first surface;

a first electromagnetic interference (EMI) shielding film disposed on the first flexible substrate, wherein the first EMI shielding film and the circuit layer are located on two opposite surfaces of the first flexible substrate; and a second EMI shielding film disposed on the second flexible substrate, wherein the second EMI shielding film and the circuit layer are located on two opposite surfaces of the second flexible substrate;

wherein the flexible coplanar waveguide low profile high speed transmission circuit satisfy the following equation:

$$\tan\left(\frac{DT/TS}{DK}\right) \geq 1$$

where DT is a distance between the signal transmission circuit line and one of the grounded line; TS is a thickness of the first flexible substrate and a thickness of the second flexible substrate, and DK is the dielectric constant of the first flexible substrate and the second flexible substrate.

2. The flexible coplanar waveguide low profile high speed transmission circuit of claim 1, wherein the first flexible substrate and the second flexible substrate are liquid crystal polymer (LCP) flexible substrates.

3. The flexible coplanar waveguide low profile high speed transmission circuit of claim 1, wherein the circuit layer directly contacts the first flexible substrate and the second flexible substrate.

4. The flexible coplanar waveguide low profile high speed transmission circuit of claim 1, wherein each of the first and the second EMI shielding film comprises:

at least a shielding metal layer; and at least a adhering layer to enable the EMI shielding film to be adhered to the first or second flexible substrate.

5. The flexible coplanar waveguide low profile high speed transmission circuit of claim 1, wherein a thickness of the first flexible substrate and a thickness of the second flexible substrate are respectively in a range from 30 μm to 200 μm.

6. The flexible coplanar waveguide low profile high speed transmission circuit of claim 1, wherein the circuit layer has a thickness equal to 35 μm.

7. The flexible coplanar waveguide low profile high speed transmission circuit of claim 1, wherein the dielectric constant DK is in a range from 2.7 to 4.

8. The flexible coplanar waveguide low profile high speed transmission circuit of claim 1, wherein the signal transmission circuit includes a pair of differential transmission lines.

9. A fabrication method of a flexible coplanar waveguide low profile high speed transmission circuit, comprising:

providing a first flexible substrate, a second flexible substrate and a circuit layer, wherein the circuit layer comprises a signal transmission circuit and two grounded circuits, and the signal transmission circuit is disposed between the two grounded circuits;

disposing the circuit layer between the first flexible substrate and the second flexible substrate;

performing a pressing step to press the first flexible substrate, the second flexible substrate and the circuit layer;

adhering a first EMI shielding film to the first flexible substrate, wherein the first EMI shielding film and the circuit layer are located on two opposite surfaces of the first flexible substrate; and adhering a second EMI shielding film to the second flexible substrate, wherein the second EMI shielding film and the circuit layer are located on two opposite surfaces of the second flexible substrate;

wherein the flexible coplanar waveguide low profile high speed transmission circuit satisfy the following equation:

$$\tan\left(\frac{DT/TS}{DK}\right) \geq 1$$

where DT is a distance between the signal transmission circuit line and one of the grounded line; TS is a thickness of the first flexible substrate and a thickness of the second flexible substrate, and DK is the dielectric constant of the first flexible substrate and the second flexible substrate.

10. The fabrication method of a flexible coplanar waveguide low profile high speed transmission circuit of claim 9, wherein the first flexible substrate and the second flexible substrate are LCP flexible substrates.

11. The fabrication method of a flexible coplanar waveguide low profile high speed transmission circuit of claim 9, wherein the circuit layer directly contacts the first flexible substrate and the second flexible substrate.

12. The fabrication method of a flexible coplanar waveguide low profile high speed transmission circuit of claim 9, wherein the first EMI shielding film comprises:

a first shielding metal layer; and a first adhering layer disposed between the first shielding metal layer and the first flexible substrate to enable first EMI shielding film to be adhered to the first flexible substrate;

the second EMI shielding film comprises:

a second shielding metal layer; and a second adhering layer disposed between the second shielding metal layer and the second flexible substrate to enable second EMI shielding film to be adhered to the second flexible substrate;

adhering the first EMI shielding film to the first flexible substrate comprising: adhering the first adhering layer to the first flexible substrate, wherein after the first adhering layer is adhered to the first flexible substrate, the first adhering layer is located between the first shielding metal layer and the first flexible substrate;

adhering the second EMI shielding film to the second flexible substrate comprising: adhering the second adhering layer to the second flexible substrate, wherein after the second adhering layer is adhered to the second flexible substrate, the second adhering layer is located between the second shielding metal layer and the second flexible substrate.

13. The fabrication method of a flexible coplanar waveguide low profile high speed transmission circuit of claim 9, wherein a thickness of the first flexible substrate and a thickness of the second flexible substrate are respectively in a range from 30 μm to 200 μm.

14. The fabrication method of a flexible coplanar waveguide low profile high speed transmission circuit of claim 9, wherein the circuit layer has a thickness equal to 35 μm.

15. The fabrication method of a flexible coplanar waveguide low profile high speed transmission circuit of claim 9, wherein the dielectric constant DK is in a range from 2.7 to 8.

16. The fabrication method of a flexible coplanar waveguide low profile high speed transmission circuit of claim 9, wherein the signal transmission circuit includes a pair of differential transmission lines.

* * * * *